United States Patent
Nakadate et al.

(10) Patent No.: US 7,566,636 B2
(45) Date of Patent: Jul. 28, 2009

(54) METHOD OF SCRIBING STUCK MOTHER SUBSTRATE AND METHOD OF DIVIDING STUCK MOTHER SUBSTRATE

(75) Inventors: Makoto Nakadate, Okaya (JP); Norihiko Kato, Matsumoto (JP); Yoichi Miyasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/846,463

(22) Filed: Aug. 28, 2007

(65) Prior Publication Data

US 2008/0057679 A1   Mar. 6, 2008

(30) Foreign Application Priority Data

Aug. 29, 2006   (JP) .............................. 2006-232730

(51) Int. Cl.
*H01L 21/00* (2006.01)
*H01L 23/544* (2006.01)

(52) U.S. Cl. ..................... 438/462; 438/38; 438/58; 438/62; 257/620; 257/E21.523; 257/E21.524

(58) Field of Classification Search ................ 438/462, 438/305, 306; 349/96
See application file for complete search history.

(56) References Cited

U.S. PATENT DOCUMENTS

| 7,094,655 B2 * | 8/2006 | Fukada et al. ............... 438/306 |
| 7,202,923 B2 * | 4/2007 | Yamabuchi et al. .......... 349/96 |
| 2005/0239258 A1 * | 10/2005 | Fukada et al. ............... 438/305 |

FOREIGN PATENT DOCUMENTS

| JP | 2004-010466 | 1/2004 |
| JP | 2005-266684 | 9/2005 |

* cited by examiner

*Primary Examiner*—William M Brewster
*Assistant Examiner*—Wilner Jean Baptiste
(74) *Attorney, Agent, or Firm*—Workman Nydegger (57) ABSTRACT

There is provided a method of scribing a stuck mother substrate for obtaining a plurality of stuck substrates formed by sticking a first square substrate and a second square substrate together so that one side of opposing two sides of the square substrates is aligned and the other side is not aligned so that the first substrate is set back to the second substrate from a stuck mother substrate in which a first mother substrate and a second mother substrate are stuck together. In the method of scribing a stuck mother substrate, the second mother substrate is strongly scribed for a full scribe line and the first mother substrate is strongly scribed for a half scribe line. On the other hand, the first mother substrate is weakly scribed for the full scribe line.

8 Claims, 6 Drawing Sheets

PRIOR ART

METHOD OF SCRIBING STUCK MOTHER SUBSTRATE AND METHOD OF DIVIDING STUCK MOTHER SUBSTRATE

The entire disclosure of Japanese Patent Application No. 2006-232730, filed Aug. 29, 2006, is expressly incorporated by reference herein.

BACKGROUND

1. Technical Field

The present invention mainly relates to a method of scribing a stuck mother substrate and a method of dividing the stuck mother substrate for obtaining a plurality of TFT (Thin Film Transistor) liquid crystal panel from an ODF (One Drop Filling) mother substrate.

2. Related Art

A scribing method for forming a scribe line by emitting a laser beam to a glass substrate has been conventionally known (for example, see JP-A-2004-10466). In the scribing method, a blind crack is to be formed along a scribe planned line by emitting a laser beam on a surface of the glass substrate for heat and forming a cooled-down area on the inside of the heat area.

Figure 6A:
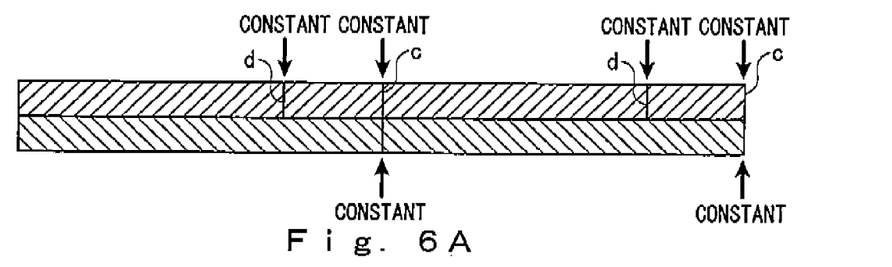
FIGS. 6A and 6B are diagrams schematically showing a conventional method of scribing the mother substrate.

Incidentally, in the liquid crystal panel in which a TFT substrate and a counter substrate are stuck together, the counter substrate is set backed (i.e., not aligned; hereinafter also referred to as "alignment-free" or "free from alignment") to the TFT substrate in one side, and a terminal area for connecting a FPC and the like is formed on the TFT substrate of the portion. Consequently, when a plurality of the liquid crystal panels are obtained (divided) from a stuck mother substrate, a full scribe line c is formed at the position of the edge surface of the TFT substrate "a" and a half scribe line d is formed at the position of the edge surface of the counter substrate b as shown in FIG. 6A, and then, breaking is to be performed. Herewith, a plurality of liquid crystal panel e in which a needless chip f corresponding to the above describe terminal area is attached are obtained.

Figure 6B:
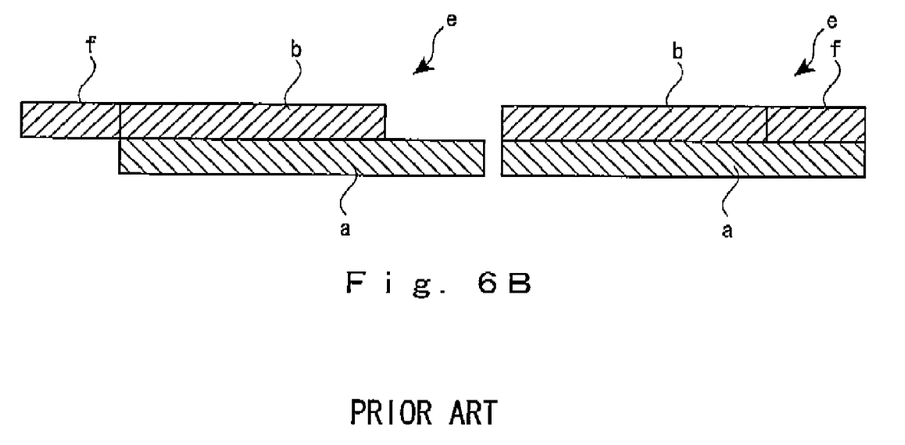

When the conventional scribing method is used in order to form the scribe lines, the TFT substrate "a" and the counter substrate b are uniformly scribed, so that the breaking stress of each line becomes almost the same. When such a stuck mother substrate is broken, the liquid crystal panel e is divided into two types. One is a type in which the needless chip f is attached at the other side and the other one is a type in which the needless chip f is attached at the own side as shown in FIG. 6B.

Consequently, in a breaking process of the needless chip f, it has been required to regard that one of the above two types of patterns divided according to the position of the needless chip f is to be a non-defective product and other one is to be a defective product, or to prepare two types of breaking mechanisms or breaking devices corresponding to the two patterns.

SUMMARY

An advantage of some aspects of the invention is that it provides a method of scribing a stuck mother substrate and a method of dividing the stuck mother substrate by which a needless chip can be always attached to a predetermined position of the stuck mother substrate to be broken.

According to a first aspect of the invention, there is provided a method of scribing a stuck mother substrate for obtaining a plurality of stuck substrates formed by sticking a square first substrate and a second square substrate together so that one side of opposing two sides of the square substrates is aligned and the other side is not aligned so that the first substrate is set back to the second substrate from a stuck mother substrate in which a first mother substrate and a second mother substrate are stuck together. In the method of scribing a stuck mother substrate, the second mother substrate is strongly scribed for a full scribe line corresponding to the alignment-free side of the second substrate, and the first mother substrate is strongly scribed for a half scribe line corresponding to the alignment-free side of the first substrate. On the other hand, the first mother substrate is weakly scribed for the full scribe line corresponding to the aligned side of the first substrate.

According to the structure, the second mother substrate is strongly scribed for the full scribe line and the first mother substrate is strongly scribed for the half scribe line. Further, the first mother substrate is weakly scribed for the full scribe line. Accordingly, when the stuck mother substrate is broken and divided into the stuck substrate, the needless chip corresponding to the set back portion is always remained to the aligned side of the first substrate in the stuck substrate. That is, when the stuck mother substrate is broken, a plurality of the stuck substrates in which the needless chip is attached to the aligned side are obtained. Accordingly, the post process for breaking the needless chip to separate from the stuck substrate can be standardized. Herewith, occurrence of defective products caused by the position of the needless chip to be attached is prevented or there is no need for preparing two types of breaking devices having a different breaking mode. Note that, in this case, the scribe may be performed, for example, by forming a scribe groove, by thermally weakening the composition by a laser beam, and by modifying the composition by a laser beam. Further, it goes without saying that when the scribe is strongly performed, the breaking stress (breaking strength) becomes small, and when weakly performed, the breaking stress becomes large.

According to a second aspect of the invention, there is provided a method of scribing a stuck mother substrate for obtaining a plurality of stuck substrates formed by sticking a first square substrate and a second square substrate together so that one side of opposing two side of the square substrates is aligned and the other side is not aligned so that the first substrate is set back to the second substrate from a stuck mother substrate in which a first mother substrate and a second mother substrate are stuck together. In the method of scribing a stuck mother substrate, the first mother substrate and the second mother substrate is strongly scribed for a full scribe line corresponding to the aligned sides of the first and second substrates. On the other hand, the first mother substrate is weakly scribed for a half scribe line corresponding to the alignment-free side of the first substrate.

According to the structure, the first mother substrate and the second mother substrate are strongly scribed for the full scribe line and the first mother substrate is weakly scribed for the half scribe line. Accordingly, when the stuck mother substrate is broken and divided into the stuck substrate, the needless chip corresponding to the set back portion is always remained to the alignment-free side of the first substrate in the stuck substrate. That is, when the stuck mother substrate is broken, a plurality of the stuck substrates in which the needless chip is attached to the alignment-free side are obtained. Accordingly, the post process for breaking the needless chip to separate from the stuck substrate can be standardized. Herewith, occurrence of defective products caused by the position of the needless chip to be attached is prevented or there is no need for preparing two types of breaking devices having a different breaking mode. Note that, in this case, the scribe may be performed, for example, by forming a scribe groove, by thermally weakening the composition by laser beam, and by modifying the composition by laser beam. Further, it goes without saying that when the scribe is strongly performed, the breaking stress (breaking strength) becomes small, and when weakly performed, the breaking stress becomes large.

Preferably, the first substrate and the second substrate are stuck together so that the other two sides except the opposing two sides are aligned in the stuck substrate.

It is also preferable that the first substrate and the second substrate are stuck together so that one side is aligned and the other side is not aligned so that the first substrate is set back to the second substrate in the other two sides except the opposing two sides in the stuck substrate.

According to the structures, the post process for breaking the needless chip can be standardized not only in the former stuck substrate in which three sides are aligned and the remaining one side is not aligned but also in the latter stuck substrate in which the adjacent two side are aligned and the remaining two side are not aligned.

In these cases, it is preferable that the first mother substrate and the second mother substrate are each a disciform glass substrate.

According to the structure, a plurality of stuck substrates, especially small size, can be efficiently obtained.

In these cases, it is preferable that the scribe is performed by a modification of a composition of the stuck mother substrate by a laser beam.

According to the structure, strength of the modification can be easily adjusted, a needless damaged portion can be reduced as much as possible, and shrinking can be improved. Note that, it is preferable to use a (laser beam of) femto second lesser for scribe.

In this case, it is preferable that the strength of the scribe is controlled by an energy amount applied to the stuck mother substrate by the laser beam.

To be more specific, it is preferable that the control of the applied energy amount is performed by altering at least one of the parameters among the parameters consisting of the relative scan speed of the laser beam to the stuck mother substrate, the power of the laser beam, the frequency of the laser beam, the number of times of the scan by the laser beam, the beam shape of the laser beam, and the focal position of the laser beam.

According to the structures, the strength of the scribe (modification) can be easily adjusted. Note that it is preferable that the strong scribe is a degree by which the stuck mother substrate is not broken by the self-weight when, for example, carrying the stuck mother substrate after scribing, and that the weak scribe is a degree by which the stuck mother substrate is not broken together when a strong scribed portion is broken.

On the other hand, it is preferable that the scribe is performed by a modification of the composition of the stuck mother substrate by a mechanical type scribe.

In this case, it is preferable that a scribe groove is formed by rotating and moving a rotating cutter having a diamond blade while pressing the rotating cutter to the stuck mother substrate in the scribe.

Further, in this case, it is preferable that the strength of the scribe is controlled by altering at least one of the parameters among the parameters consisting of the relative movement speed of the diamond blade to the stuck mother substrate, the pressing pressure of the diamond blade, and the pressing depth of the diamond blade.

According to the structures, it becomes possible to give the strong and weak of the scribe in a similar way also when the scribe groove is formed by a so called physical method (mechanical scribing method). Note that the rotating cutter having a diamond blade is so called a wheel cutter.

In these cases, it is preferable that the stuck substrate is a TFT liquid crystal panel and the stuck mother substrate is an ODF mother substrate.

According to the structure, the liquid crystal panel can be easily and effectively manufactured, so that the cost of the liquid crystal panel can be reduced.

According to another aspect of the invention, there is provided a method of dividing a stuck mother substrate. In the dividing method, the method of scribing a stuck mother substrate described above is performed in a scribing step. Then, the stuck mother substrate is broken along the full scribe line and the half scribe line to obtain a plurality of the stuck substrates in which a needless chip corresponding to the set back portion is attached in a breaking step.

Further, it is preferable to include a chip breaking step for breaking the needless chip from the each stuck substrate in which the needless chip is attached after the breaking step.

According to the structure, a plurality of the stuck substrates can be effectively obtained from the stuck mother substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a method of scribing a stuck mother substrate and a method of dividing the stuck mother substrate according to a first embodiment of the invention will be described. The stuck mother substrate of the embodiment is a so called disk-shaped ODF mother substrate. In the dividing method of the embodiment, the ODF mother substrate is to be divided in a matrix manner to obtain a plurality of compact TFT liquid crystal panels.

Figure 1A:
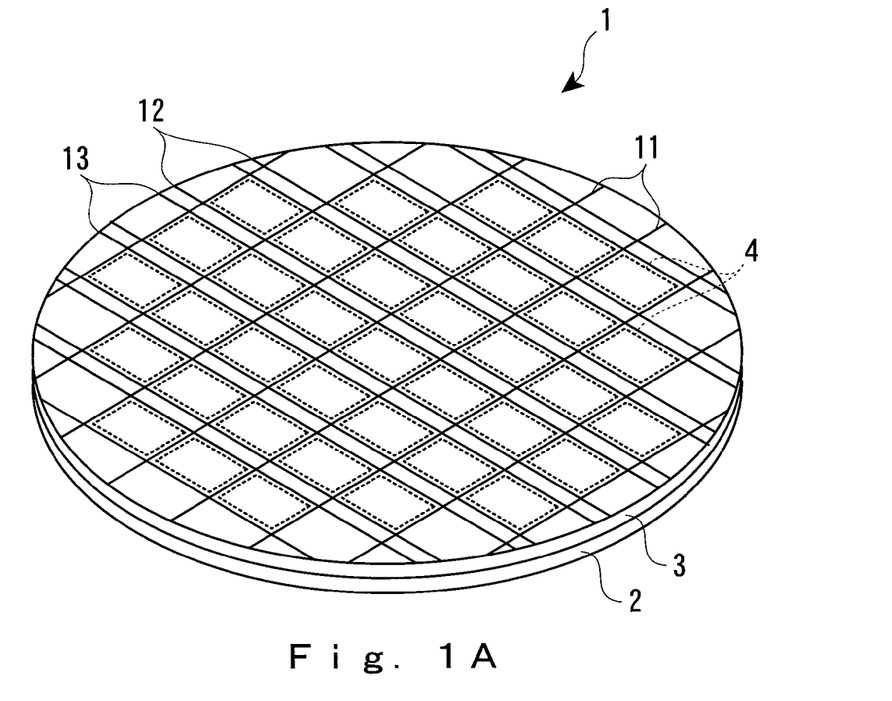
FIG. 1A is an external appearance perspective view of an ODF mother substrate (A)
Figure 1B:
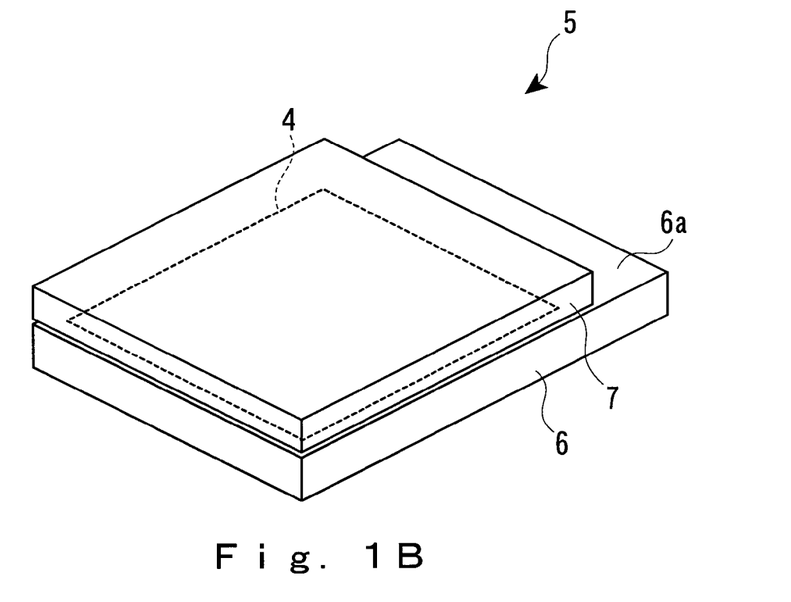
FIG. 1B is an external appearance perspective view of a TFT liquid crystal panel (B).

As shown in FIGS. 1A and 1B, an ODF mother substrate 1 is constituted by sticking a TFT mother substrate (array substrate: second mother substrate) 2 which is a circular glass substrate in which a plurality of TFTs are formed in a matrix manner and a counter mother substrate (color filter substrate: first mother substrate) 3 which is a circular glass substrate via a sealing material 4 which is formed by dropping a liquid crystal on the second mother substrate 2 (see FIG. 1A). On the other hand, a TFT liquid crystal panel 5 divided from the ODF mother substrate 1 has a structure in which a TFT substrate (second substrate) 6 and a counter substrate (first substrate) are stuck together via the sealing material 4 and is formed in a square shape as a whole. In this case, two sides of the longitudinal direction and one side of the horizontal direction of the TFT substrate 6 and the counter substrate 7 of the TFT liquid crystal panel 5 are aligned. However, the remaining one side of the horizontal direction of the counter substrate 7 is set back and not aligned to that of the TFT substrate 6. Then, a terminal aria 6a for connecting an FPC and the like is constituted on the TFT substrate 6 of the set back portion (see FIG. 1B).

Accordingly, as shown in FIG. 1A, longitudinal full scribe lines 11 matching to the width of the TFT liquid crystal panel 5 (corresponding to the two sides of the longitudinal direction) and horizontal full scribe lines 12 matching to the length of the TFT liquid crystal panel 5 (corresponding to the two sides of the horizontal direction) are to be formed and horizontal half scribe lines 13 corresponding to the alignment-free side of the counter substrate 7 are to be formed in the ODF mother substrate 1 from which a plurality of the TFT liquid panels 5 are obtained. Then, in order to constitute the terminal area 6a of the TFT substrate 6, the portion of the counter mother substrate 3 is divided to be a needless chip 8.

Next, a scribe break process for obtaining a plurality of the TFT liquid crystal panels 5 from the ODF mother substrate 1 will be described with reference to FIGS. 2A to 2F.

Figure 2A:
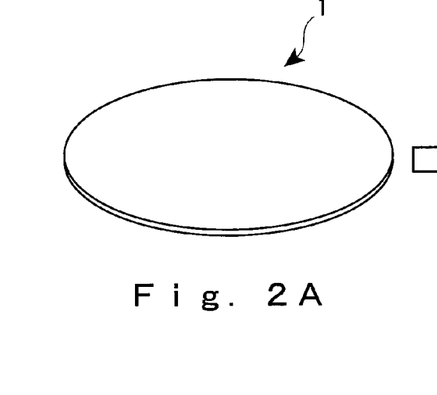
FIGS. 2A to 2F are explanatory diagrams showing a scribe break process for obtaining a plurality of TFT liquid crystal panels from the ODF mother substrate (A).
Figure 2B:
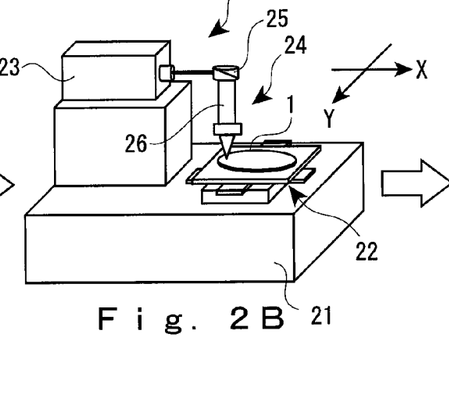

First, the ODF mother substrate 1 is prepared (FIG. 2A), and the ODF mother substrate 1 is scribed by a laser scribe device 20 (FIG. 2B). The laser scribe device 20 is for a femto second laser (F s laser), and an XY table 22 is mounted on a mechanical board 21. Further, a laser oscillator 23 and an optical holder 24 for emitting a laser beam emitted from the laser oscillator 23 to the ODF mother substrate 1 are mounted in the laser scribe device 20. A mirror 25 and an auto focus lens unit 26 are incorporated in the optical holder 24 and the focal length (focal position) of the laser beam is to be able to be finely adjusted.

Figure 2C:
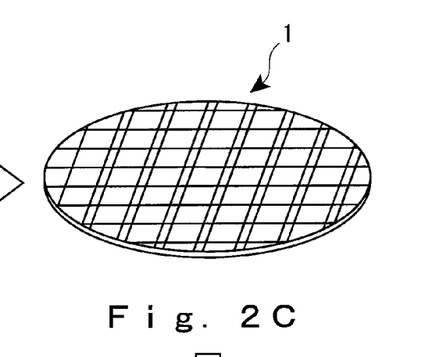

The ODF mother substrate 1 is set on the XY table 22 in an alignment manner and scribed by the movement of the XY table 22 in the X axis direction and Y axis direction and the emission of the laser beam synchronized therewith. That is, the longitudinal full scribe lines 11 are formed by the movement of the ODF mother substrate 1 in the X axis direction and the emission of the laser beam, and the horizontal full scribe lines 12 and the horizontal half scribe lines 13 are formed by the movement of the ODF mother substrate 1 in the Y axis direction and the emission of the laser beam (FIG. 2C). First, in the actual operation, the longitudinal full scribe lines 11, the horizontal full scribe lines 12, and the horizontal half scribe lines 13 are formed to the upper side counter mother substrate 3, then the ODF mother substrate 1 is turned upside down to be set, and the longitudinal full scribe lines 11 and the horizontal full scribe lines 12 are formed to the TFT mother substrate 2.

In addition, when forming each scribe line 11, 12, and 13, the scribe is to be performed in a stepwise fashion by increasing the depth in the thickness direction with respect to each mother substrate 2 and 3. That is, a modified portion is formed (modification) in a stepwise fashion to each mother substrate 2 and 3 in the thickness direction by the reciprocation (scan) of the XY table 22 and by gradually lowering the auto focus focal point of the laser beam for the every scan. The modified portion (scribe) is to be lengthened in the thickness direction by a plurality of scanning as described above, so that the strength of the scribe can be freely adjusted by the number of times of the scanning, the pitch of the modified portion, or the like (the detail will be described below).

Figure 2D:
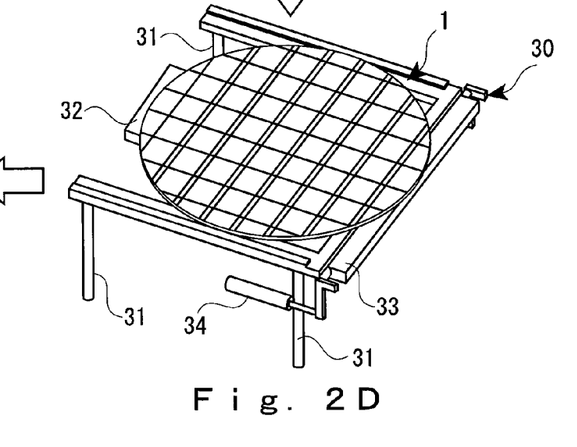

When each scribe line 11, 12, and 13 is formed to the ODF mother substrate 1 as described above, then, the ODF mother substrate 1 is set to a brake device 30 for break (FIG. 2D). The brake device 30 is constituted by mounting a main table 32 and a sub table 33 rotatably attached at an edge portion of the main table 32 on four poles 31. Both of the main table 32 and the sub table 33 are constituted by an absorption table, and an air cylinder 34 for turning the sub table 33 in the bottom direction is coupled with the sub table 33.

First, the ODF mother substrate 1 already scribed is set so that the most outer end horizontal full scribe line 12 is positioned at the border line between the main table 32 and the sub table 33 and absorbed by the both tables 32 and 33. Then, the ODF mother substrate 1 is broken by turning the sub table 33 by the air cylinder 34. The ODF mother substrate 1 is broken along the horizontal scribe lines 12 in series in the procedure to be divided into a plurality of strip ODF mother substrates 1. Next, each of the plurality of strip ODF mother substrates 1 is divided one by one by the same procedure described above along the longitudinal full scribe line 11 this time. Of course, the strip ODF mother substrates 1 may be broken by using another breaking device.

Figure 2E:
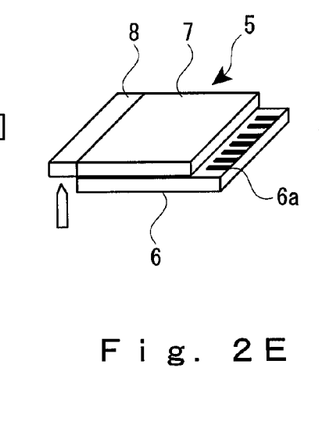
Figure 2F:
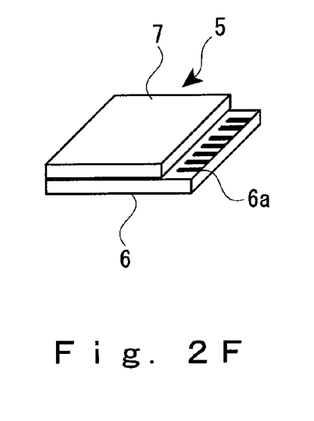

In this manner, a plurality of the TFT liquid crystal panels 5 in which the needless chip 8 is attached to the other side are singly produced for the last time (FIG. 2E). Herein, each singly produced TFT liquid crystal panel 5 is set to a device (not shown) and the needless chip 8 is broken to complete the operation (FIG. 2F).

Figure 3A:
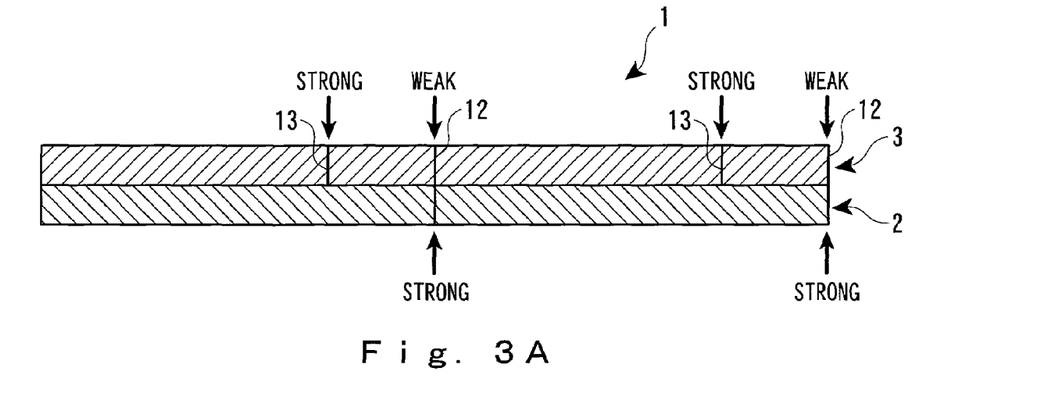
FIGS. 3A to 3C are diagrams schematically showing a method of scribing the ODF mother substrate according to a first embodiment.
Figure 3B:
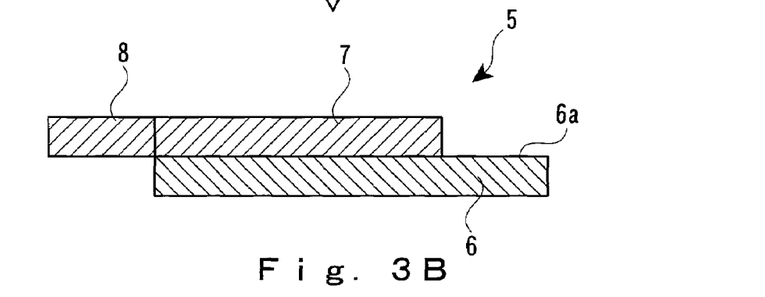
Figure 3C:
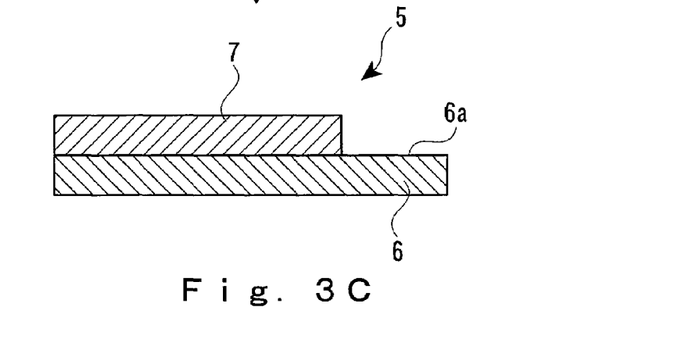

Next, a method of scribing the ODF mother substrate 1 in which the scribe is devised so that the needless chip 8 is to be always attached at the other side of the TFT liquid crystal panel 5 to be broken with reference to FIGS. 3A to 3C.

As shown in FIG. 3A, the scribe (modification) to the TFT mother substrate 2 for the horizontal full scribe lines 12 is strongly performed, on the other hand, the scribe (modification) to the counter mother substrate 3 for the horizontal full scribe lines 12 is weakly performed to the ODF mother substrate 1 (FIG. 3A). In addition, the scribe (modification) to the counter mother substrate 3 for the horizontal half scribe lines 13 is strongly performed (FIG. 3A). Note that, the scribe (modification) to the TFT mother substrate 2 and the counter mother substrate 3 is to be strongly performed as for the longitudinal full scribe lines 11.

The strength of the scribe in this case is, in other words, the large and small of the breaking stress. When the modification (scribe) to the TFT mother substrate 2 and the counter mother substrate 3 is strong, the breaking stress (breaking intensity) of these mother substrates 2 and 3 becomes small, and when week, the breaking stress (breaking intensity) of these mother substrates 2 and 3 becomes large. In addition, it is preferable that, for example, the strong scribe is a degree at which the ODF mother substrate 1 is not broken by the self weight when, for example, carried after scribing and the weak scribe is a degree at which the weak scribe portion is not broken together when the strong scribe portion is broken in the degree of the strength of the scribe.

On the other hand, the strength of the scribe is controlled by the degree of the energy amount of the laser beam applied to the TFT mother substrate 2 and the counter mother substrate 3. To be more specific, the control of the strength of the scribe is performed by altering at least one of the parameters among the parameters such as the movement speed of the XY table 22 which is a relative scan speed of the laser beam, the number of times of scan, the power of the laser beam to be emitted, the frequency of the laser beam, the beam shape of the laser beam, the focal position of the laser beam, and the like. If the movement speed of the XY table 22 is slow when the other parameters are the same, the energy amount applied by the laser beam becomes large, so that the scribe is strongly performed, and if high, the energy amount applied by the laser beam becomes small, so that the scribe is weakly performed. In the same way, if the number of times of scan is large, the scribe is strongly performed, and if small, the scribe is weakly performed. The same is true for the power and frequency of the laser beam. Further, when the beam shape of the laser beam (spot) is small by light focus, the scribe is strongly performed, and when large, the scribe is weakly performed. Further, when the focal position of the laser beam is concentrated near the both ends in the thickness direction of the substrate, the scribe is strongly performed, and when concentrated near the center, the scribe is weakly performed.

In this way, by giving the strong and weak to the scribe of the horizontal full scribe lines 12 and the horizontal half scribe lines 13, the TFT liquid crystal panel 5 is to be broken so that the needless chip 8 is always attached to the other side (FIG. 3B). Consequently, in the post process (chip break process), occurrence of defective products caused by the position of the needless chip 8 to be attached is prevented and the needless chip 8 can be effectively broken by a single breaking mechanism or breaking device (FIG. 3C).

Next, a method of scribing the ODF mother substrate 1 according to a second embodiment will be described with reference to FIGS. 4A to 4C.

Figure 4A:
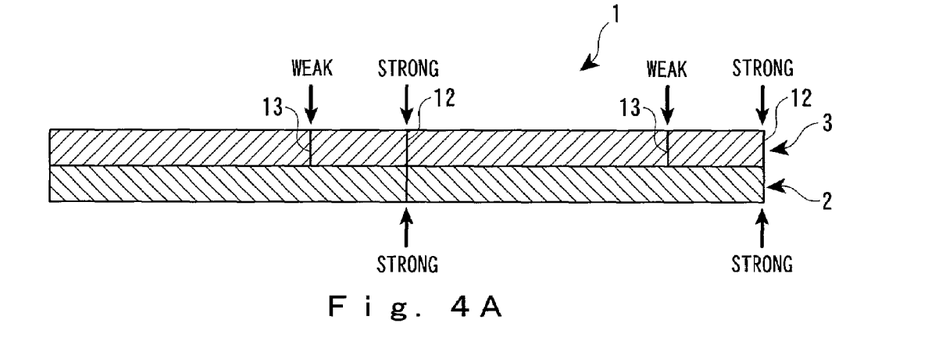
FIGS. 4A to 4C are diagrams schematically showing a method of scribing the ODF mother substrate according to a second embodiment.

In the scribing method of the embodiment, the scribe (modification) to the TFT mother substrate 2 and the counter mother substrate 3 for the horizontal full scribe lines 12 is to be strongly performed and the scribe (modification) to the counter mother substrate 3 for the horizontal half scribe lines 13 is to be weakly performed with respect to the ODF mother substrate 1 (FIG. 4A).

Figure 4B:
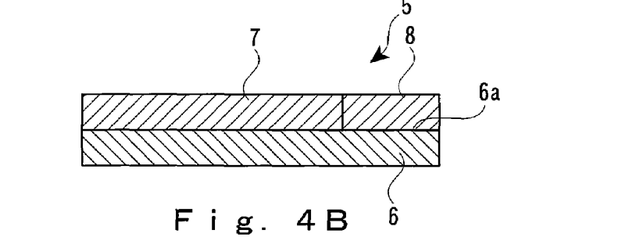
Figure 4C:
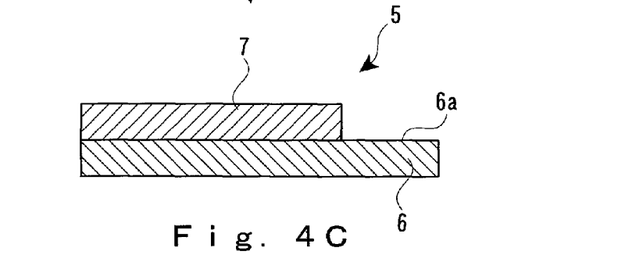

The TFT liquid crystal panel 5 is to be broken so that the needless chip 8 is always attached at the own side also in this case (FIG. 4B). Consequently, in the post process (chip break process), occurrence of defective products caused by the position of the needless chip 8 to be attached is prevented and the needless chip 8 can be effectively broken by a single breaking mechanism or breaking device (FIG. 4C).

Figure 5:
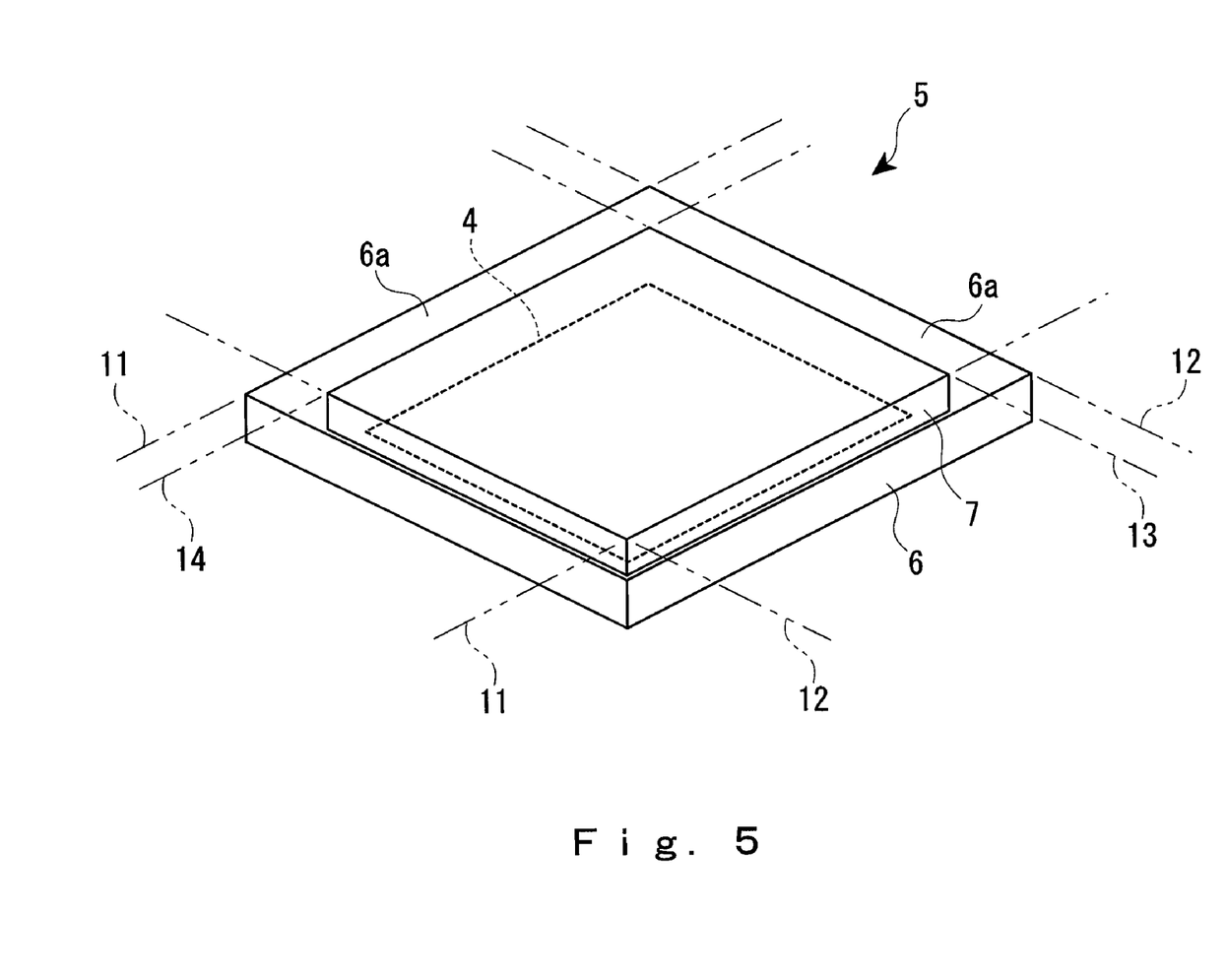
FIG. 5 is an external appearance perspective view of a TFT liquid crystal panel according to another embodiment.

FIG. 5 shows a TFT liquid crystal panel 5 of another embodiment. Adjacent two sides of the TFT substrate 6 and the counter substrate 7 in the longitudinal and horizontal directions are aligned in the TFT liquid crystal panel 5. On the other hand, the counter substrate 7 is set backed to the TFT substrate 6 and not aligned in the remaining two longitudinal and horizontal sides. Accordingly, two horizontal and longitudinal terminal areas 6a are formed on the TFT substrate 6.

In this case, longitudinal half scribe lines 14 are to be formed to the ODF mother substrate 1 in addition to the longitudinal full scribe lines 11, the horizontal full scribe lines 12, and the horizontal half scribe lines 13. Further, it goes without saying that the strength of the break in these break lines is modified, that is, the pattern of the strength of the break in the longitudinal lines is modified to that of the horizontals lines in the first and second embodiments.

In the embodiment, the modification of the ODF mother substrate 1 is to be performed by the femto second leaser. However, it should be noted here that the invention is also applied to a scribing method such as a method for forming a scribe groove and a method for thermally weakening the composition by a laser beam. In the former case, it is preferable that the strength of the scribe is adjusted by the depth of the scribe grove to be formed or the like. In the latter case, it is preferable that the strength of the scribe is adjusted by the heat quantity to be applied or the like. Further, the stuck mother substrate of the invention is not limited to the ODF mother substrate 1 of the embodiments.

Incidentally, in the former case in which the scribe groove is mechanically formed, a wheel cutter which is a rotating cutter having a so called diamond blade is used. That is, the scribe groove is formed by rotating (advancing) the diamond blade while pressing the diamond blade to the ODF mother substrate 1. The scribing method also corresponds to the modification of the composition of the ODF mother substrate 1 according to the mechanical type scribe. Then, the strength of the scribe in this case is performed by altering at least one of the parameters among the parameters consisting of the relative movement speed of the diamond blade to the ODF mother substrate 1, the pressing pressure of the diamond blade, and the pressing depth of the diamond blade.

When the relative movement speed of the diamond blade to the ODF mother substrate 1 is slow, the scribe is strongly performed, and when fast, the scribe is weakly performed. In addition, when the pressing pressure of the diamond blade is strong, the scribe is strongly performed and when weak, the scribe is weakly performed. The same is true for the power and the frequency of the laser beam. By the same token, when the pressing depth of the diamond blade (corresponding to the depth of the groove) is deep, the scribe is strongly performed, and when shallow, the scribe is weakly performed.

In this manner, the strength of the scribe can be similarly controlled also when the scribe groove is formed by a so called physical method (mechanical scribing method).

What is claimed is:

1. A method of scribing a stuck mother substrate in order to obtain a plurality of stuck substrates from a stuck mother substrate in which a first mother substrate and a second mother substrate are stuck together, where the plurality of stuck substrates includes a first square of the first mother substrate and a second square of the second mother substrate stuck together so that one side of each of the square substrates are aligned while the other sides of each of the square substrates are not aligned so that unaligned side of the first mother substrate is offset from the unaligned side of the second mother substrate, the method of scribing the stuck mother substrate comprising:

performing a first scribe process at a first predetermined strength on the second mother substrate which is stuck to the first mother substrate to form a full scribe line forming the unaligned side of the second substrate and to form a half scribe line which forms the unaligned side of the first mother substrate, the half scribe line being offset in a lateral direction from the full scribe line; and performing a second scribe process on the first mother substrate at a second predetermined strength which is weaker than the first predetermined strength in order to form a full scribe line to form the aligned side of the first substrate.

2. A method of scribing a stuck mother substrate in order to obtain a plurality of stuck substrates from a stuck mother substrate in which a first mother substrate and a second mother substrate are stuck together, where the plurality of stuck substrates includes a first square of the first mother substrate and a second square of the second mother substrate stuck together so that one side of each of the square substrates are aligned while the other sides of each of the square substrates are not aligned so that unaligned side of the first mother substrate is offset from the unaligned side of the second mother substrate, the method of scribing the stuck mother substrate comprising:

performing a first scribe process at a first predetermined strength on the first mother substrate and second mother substrate to form a full scribe line which forms the aligned sides of the first and second substrates; and performing a second scribe process on the first mother substrate to form a half scribe line which forms the unaligned side of the first substrate which is offset in a lateral direction from the full scribe line formed in the first scribe process.

3. The method of scribing a stuck mother substrate according to claim 1, wherein the first substrate and the second substrate are stuck together so that the other two sides except the opposing two sides are aligned in the stuck substrate.

4. The method of scribing a stuck mother substrate according to claim 1, wherein the first substrate and the second substrate are stuck together so that one side is aligned and the other side is free from alignment so that the first substrate is set back to the second substrate in the other two sides except the opposing two sides in the stuck substrate.

5. The method of scribing a stuck mother substrate according to claim 1, wherein the first mother substrate and the second mother substrate are each a disciform glass substrate.

6. The method of scribing a stuck mother substrate according to claim 1, wherein the stuck substrate is a TFT liquid crystal panel and the stuck mother substrate is an ODF mother substrate.

7. A method of dividing a stuck mother substrate comprising: performing the method of scribing a stuck mother substrate described in claim 1; and breaking the stuck mother substrate along the full scribe line and the half scribe line to obtain a plurality of the stuck substrates in which a needless chip corresponding to the set back portion is attached.

8. The method of dividing a stuck mother substrate according to claim 7, further comprising:

breaking the needless chip from the each stuck substrate in which the needless chip is attached after breaking the stuck mother substrate.

* * * * *